US010426047B2

(12) United States Patent
Kato

(10) Patent No.: US 10,426,047 B2
(45) Date of Patent: Sep. 24, 2019

(54) WIRING MEMBER CONNECTION STRUCTURE

(71) Applicant: Yazaki Corporation, Minato-ku, Tokyo (JP)

(72) Inventor: Shingo Kato, Susono (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 16/211,824

(22) Filed: Dec. 6, 2018

(65) Prior Publication Data

US 2019/0174641 A1    Jun. 6, 2019

(30) Foreign Application Priority Data

Dec. 6, 2017   (JP) .................. 2017-234510

(51) Int. Cl.
*H01R 12/00*    (2006.01)
*H05K 5/00*    (2006.01)
*H02G 3/36*    (2006.01)
*H01R 12/58*    (2011.01)
*H05K 1/11*    (2006.01)
(Continued)

(52) U.S. Cl.
CPC .......... *H05K 5/0069* (2013.01); *H01R 12/58* (2013.01); *H02G 3/36* (2013.01); *H05K 1/115* (2013.01); *H05K 5/006* (2013.01); *H05K 5/0073* (2013.01); *H05K 5/0247* (2013.01); *H05K 5/069* (2013.01); *B60R 16/0207* (2013.01); *B60R 16/033* (2013.01); *H01R 12/722* (2013.01);
(Continued)

(58) Field of Classification Search
CPC ...... H05K 5/0069; H05K 5/069; H05K 1/115; H05K 5/006; H05K 5/0073; H05K 5/0247; H05K 5/0056; H01R 12/58; H01R 2201/26; H01R 12/722; H01R 12/594; H01R 9/0512; H01R 4/64; H01R 23/662; H01R 11/288; H02G 3/36; H02G 3/088; B60R 16/0207; B21C 47/12
USPC .......................................... 439/55
See application file for complete search history.

(56) References Cited

U.S. PATENT DOCUMENTS 3,337,834 A * 8/1967 Godwin ............... H01R 12/594
174/36
4,834,660 A * 5/1989 Cotti ..................... H01R 12/82
361/749
(Continued)

FOREIGN PATENT DOCUMENTS

JP    2016-220276 A    12/2016

*Primary Examiner* — Jean F Duverne
(74) *Attorney, Agent, or Firm* — Banner & Witcoff, Ltd.

(57) ABSTRACT

A wiring member connection structure is provided. The wiring member connection structure includes: a flat wiring member formed by covering an outer circumference of a belt-like flat conductor with an insulating coating; a bolt which is erect and bonded perpendicularly to a conductor flat surface of the flat conductor exposed at an intermediate position of the flat wiring member where the coating is removed; a circuit board that has a connector conductively connected to the bolt through a circuit conductor and that is fastened and fixed to the bolt penetrating the circuit board; and a casing that has a casing bottom wall including a bolt insertion hole through which the bolt is inserted to penetrate the circuit board, and that covers the circuit board so as to expose a connector fitting portion of the connector to the outside.

5 Claims, 5 Drawing Sheets

(51) Int. Cl.
*H05K 5/02* (2006.01)
*H05K 5/06* (2006.01)
*B60R 16/033* (2006.01)
*H01R 12/72* (2011.01)
*H02G 3/08* (2006.01)
*B60R 16/02* (2006.01)

(52) U.S. Cl.
CPC ......... *H01R 2201/26* (2013.01); *H02G 3/088* (2013.01); *H05K 5/0056* (2013.01)

(56) References Cited

U.S. PATENT DOCUMENTS

| | | | | |
|---|---|---|---|---|
| 5,814,769 | A * | 9/1998 | Karlstrom | H01R 23/662 174/117 F |
| 6,824,402 | B2 * | 11/2004 | Kuo | H01R 4/64 174/74 R |
| 6,899,562 | B1 * | 5/2005 | Ruff | H01R 9/0512 439/571 |
| 7,494,085 | B2 * | 2/2009 | Bordignon | B21C 47/12 242/478 |
| 2018/0174716 | A1 * | 6/2018 | Kominato | H01R 11/288 |
| 2019/0168694 | A1 * | 6/2019 | Kato | B60R 16/0207 |

\* cited by examiner

WIRING MEMBER CONNECTION STRUCTURE

CROSS-REFERENCE TO RELATED APPLICATIONS

This application is based on and claims priority under 35 USC 119 from Japanese Patent Application No. 2017-234510 filed on Dec. 6, 2017, the contents of which are incorporated herein by reference.

TECHNICAL FIELD

The present invention relates to a wiring member connection structure.

BACKGROUND ART

In the background art, there has been known a wiring member connection structure in which a long mainline wiring member and a branch wiring member are electrically connected. The long mainline wiring member is routed in a vehicle to be able to transmit electric power. The branch wiring member is routed in the vehicle to be able to transmit electric power, and branches off from the mainline wiring member. As such a connection structure, the following connection structure will be shown by way of example. In a vehicle mounted with a battery on a rear side thereof, assume that a long mainline wiring member is routed in a front/rear direction of the vehicle in order to supply electric power from the battery on the rear side of the vehicle to an electrical component on a front side of the vehicle. In this case, a branch wiring member for supplying electric power to another electrical component is electrically connected to an intermediate position of the long mainline wiring member by the connection structure.

In the wiring member connection structure according to the background art, usually, the mainline wiring member is cut at a branch portion and terminal piece structures are provided respectively at cut portions of the two cut mainline wiring member parts. The respective terminal piece structures are individually connected to predetermined connection portions of a power supply distribution box by bolting, and the branch wiring member is individually connected to another connection portion of the power supply distribution box by bolting (e.g. see PTL 1).

Thus, the two cut mainline wiring member parts are electrically connected through an electric circuit inside the power supply distribution box, and the mainline wiring member parts and the branch wiring member are electrically connected through the electric circuit inside the power supply distribution box.

CITATION LIST

Patent Literature

PTL 1: JP-A-2016-220276

SUMMARY OF INVENTION

However, in the aforementioned wire member connection structure, the cut two mainline wiring member parts are electrically connected through the power supply distribution box. For this reason, there may arise a problem that the number of connection places is so large that reliability about the electric connection of the mainline wiring member parts is easily lowered.

The present invention has been accomplished in consideration of the aforementioned situation. An object of the present invention relates to a wiring member connection structure that can connect another wiring member to an intermediate position of each wiring member with high connection reliability.

Solution to Problem

The foregoing object according to the present invention can be attained by the following configurations.

(1) A wiring member connection structure includes: a flat wiring member formed by covering an outer circumference of a belt-like flat conductor with an insulating coating; a bolt that is erect and bonded perpendicularly to a conductor flat surface of the flat conductor exposed at an intermediate position of the flat wiring member where the coating has been removed; a circuit board that has a connector conductively connected to the bolt through a circuit conductor and that is fastened and fixed to the bolt penetrating the circuit board; and a casing that has a casing bottom wall including a bolt insertion hole through which the bolt is inserted to penetrate the circuit board, and that covers the circuit board so as to expose a connector fitting portion of the connector to the outside.

According to the wiring member connection structure having the aforementioned configuration (1), the bolt is erect and bonded perpendicularly to the conductor flat surface of the flat conductor exposed at the intermediate position of the belt-like flat wiring member where the coating has been removed. The circuit board is fastened to the bolt that has penetrated the casing bottom wall of the casing covering the circuit board. The connector conductively connected to the bolt is provided on the circuit board, and the connector fitting portion of the connector is exposed to the outside from the casing. A counterpart connector provided on a terminal of another wiring member is fitted to the connector fitting portion exposed from the casing. That is, the other wiring member can be electrically connected to the intermediate position of the flat wiring member in a state in which the flat wiring member is not cut but is continuous over an entire area in a longitudinal direction. The other wiring member is connected to the flat wiring member without dividing the flat wiring member. Accordingly, the number of connection places can be reduced. As a result, the wiring member connection structure having the present configuration can have higher electric connection reliability between the flat wiring member and the other wiring member than the background-art wiring member connection structure in which the two cut mainline wiring member parts are electrically connected through the electric power distribution box.

(2) The wiring member connection structure according to the aforementioned configuration (1), wherein a plurality of flat wiring members is laminated in a thickness direction thereof, and an extraction portion is provided for extracting the bolt bonded to the conductor flat surface of a lower one of the laminated flat wiring members while avoiding an upper one of the laminated flat wiring members.

According to the wiring member connection structure having the aforementioned configuration (2), the flat wiring members are laminated to each other to form a laminated wiring body in which a plurality of circuits are laminated. In such a lamination structure, the upper flat wiring member is superimposed on the lower flat wiring member. For this reason, conductive connection to another wiring member in an upper surface of the intermediate position of the lower flat wiring member in an extension direction thereof is usually difficult. To solve this problem, the wiring member connection structure having the present configuration is provided with the extraction portion. The extraction portion has a function to prevent the upper flat wiring member from standing in the way of conducive connection to the bolt provided on the upper surface of the lower flat wiring member. Thus, conductive connection to the flat wiring members in the respective layers of the laminated wiring body can be performed at desirable intermediate positions of the laminated wiring body in the extension direction. As a result, the laminated wiring body routed in a vehicle can be used to make it easy to connect a power supply etc. to accessories at a short distance. The accessories are mounted at desirable positions of the vehicle. That is, the flat wiring members can be electrically connected to other wiring members in a state in which the flat wiring members are not cut but extend continuously over the entire area in the longitudinal direction. In other words, the degree of freedom for selecting connection positions of the other wiring members is improved.

(3) The wiring member connection structure according to the aforementioned configuration (2), wherein the extraction portion serves as a bypass portion where the flat wiring members is bent in a width direction thereof so as to prevent the flat wiring members from being superimposed on each other.

According to the wiring member connection structure having the aforementioned configuration (3), the bypass portion is formed in the at least one flat wiring member. The bypass portion serves as the extraction portion where the at least one flat wiring member is bent in the width direction thereof to prevent the flat wiring members from being superimposed on each other. When the flat wiring members are superimposed on each other, the bolt erectly provided on the bypass portion of the flat wiring member is not superimposed on the other flat wiring member. Thus, bolts can be disposed on an upper surface of the laminated wiring body so as to be arranged side by side in the width direction crossing the extension direction of the laminated wiring body. The circuit board can be fastened and fixed to the bolts. According to the wiring member connection structure, the pair of bolts that are, for example, connected to a positive electrode and a negative electrode can be provided on the laminated wiring body relatively narrow in width, and side by side in the width direction of the laminated wiring body. In addition, an insertion hole of the lower flat wiring member through which the bolt is inserted does not have to be bored in the upper flat wiring member. Accordingly, a decrease of a sectional area in the upper flat wiring member can be suppressed.

(4) The wiring member connection structure according to the aforementioned configuration (2), wherein the extraction portion serves as a notch portion that is formed by cutting out a side edge of the upper flat wiring member in a width direction perpendicular to an extension direction of the upper flat wiring member so that the bolt is inserted through the notch portion.

According to the wiring member connection structure having the aforementioned configuration (4), the bolt is erectly provided on the lower flat wiring member and at the position where the bolt erectly provided on the lower flat wiring member and another bolt erectly provided on the upper flat wiring member are not superimposed on each other in the extension direction of the laminated wiring body. When the upper flat wiring member is superimposed on the lower flat wiring member, the bolt erectly provided on the lower flat wiring member is inserted through the notch portion that is formed in the upper wiring member. Thus, the bolt conductively connected to the lower flat wiring member and the other bolt conductively connected to the upper flat wiring member are disposed on the upper surface of the laminated wiring body to be arranged side by side in the extension direction of the laminated wiring body. The circuit board is fastened and fixed to the bolts. According to the wiring member connection structure, the bolts can be disposed along the extension direction of the laminated wiring body and within the width range of the laminated wiring body.

(5) The wiring member connection structure according to any one of the aforementioned configurations (1) to (4), wherein an annular packing mounted on an outer circumference of the bolt seals a gap between the casing bottom wall and the flat wiring member watertightly.

According to the wiring member connection structure having the aforementioned configuration (5), the annular packing is mounted on the outer circumference of the bolt, and the circuit board is fastened and fixed to the bolt to squash the annular packing. Thus, a connection portion between the flat wiring member and the casing can be easily made waterproof.

According to the wiring member connection structure according to the present invention, it is possible to connect another wiring member to an intermediate position of each wiring member with high connection reliability.

The present invention has been described above briefly. Further, when a mode (hereinafter referred to as "embodiment") for carrying out an undermentioned invention is read through with reference to the accompanying drawings, details of the present invention can be made clearer.

DESCRIPTION OF EMBODIMENTS

An embodiment according to the present invention will be described below with reference to the drawings.

A wiring member connection structure according to the present embodiment provides a connection structure that is excellent in connection reliability and water sealing performance in a backbone wire harness expected as a future wire harness routing form (in a form in which a power supply distribution box is connected to an intermediate portion of a battery cable, and power is distributed from the power supply distribution box).

Figure 1:
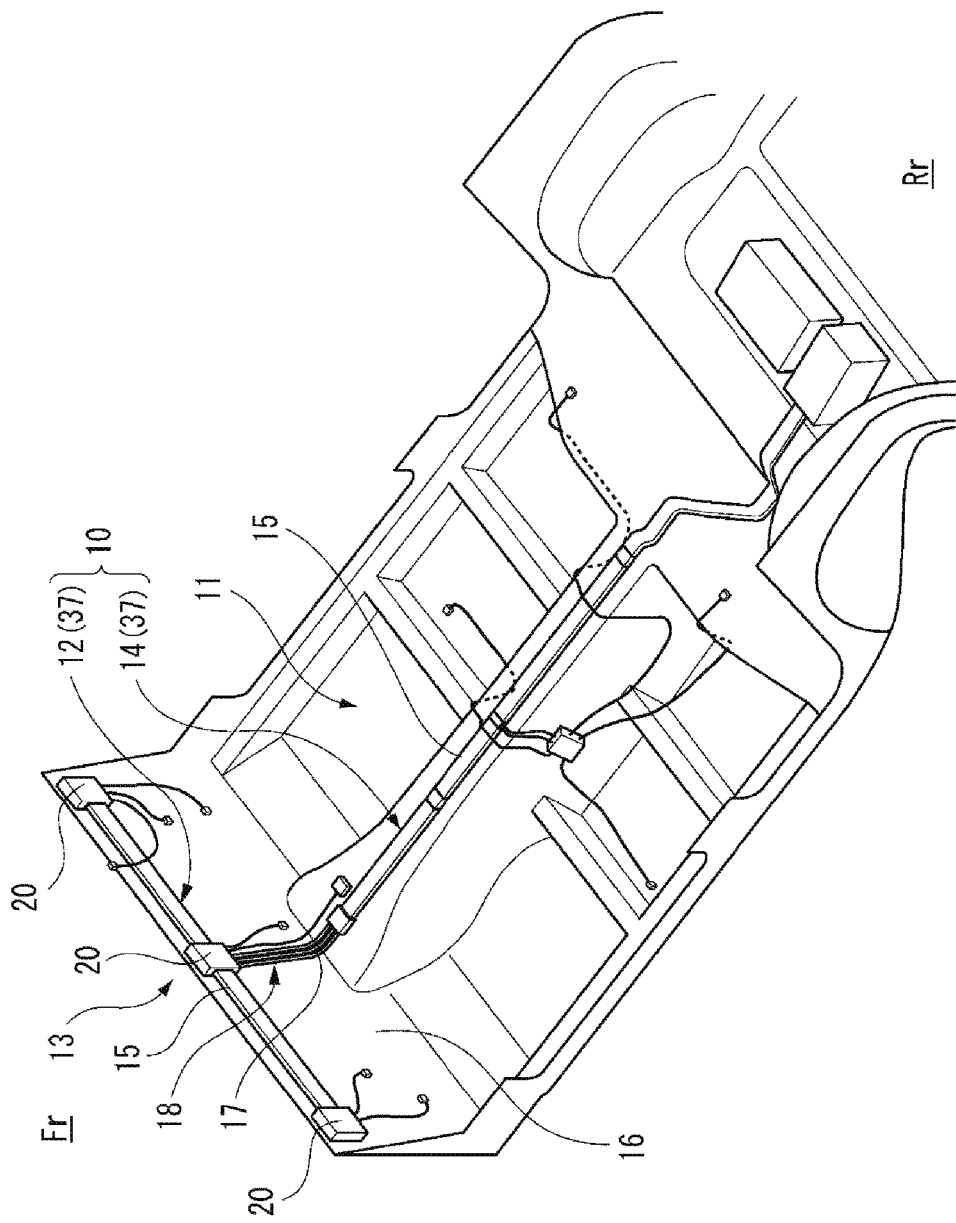
FIG. 1 is a perspective view showing an underbody of a vehicle mounted with a wiring member connection portion connected by a wiring member connection structure according to an embodiment of the present invention.

FIG. 1 is a perspective view showing an underbody 11 mounted with a wiring member connection portion 13 connected by the wiring member connection structure according to the embodiment of the present invention. In the underbody 11 serving as a body panel, a front of the vehicle is denoted as Fr, and a rear of the vehicle is denoted as Rr in accordance with a direction viewed from a driver.

As shown in FIG. 1, a vehicle circuit body 10 according to the present embodiment is provided with a floor wire harness 14, an instrument panel wire harness 12, and a plurality of control boxes 20 as basic constituent members. The floor wire harness 14 is routed in the underbody 11. The instrument panel wire harness 12 is routed in a dash panel 16. The control boxes 20 are disposed dispersively along the harnesses.

The instrument panel wire harness 12 is disposed linearly in a left/right direction at a place extending along a face of the dash panel 16 so that the instrument panel wire harness 12 can be substantially parallel with a not-shown reinforcement at a position above the reinforcement. Incidentally, the instrument panel wire harness 12 may be fixed to the reinforcement.

In addition, the floor wire harness 14 is disposed on a substantially laterally central portion of a vehicle body along the underbody 11 so as to extend in a front/rear direction of the vehicle body. Other wiring members 18 that are rising portions connected to a front end portion of the floor wire harness 14 to rise along the face of the dash panel 16 extend linearly in an up/down direction. Front ends of the other wiring members 18 are connected to one of the control boxes 20 at an intermediate portion of the instrument panel wire harness 12. That is, the vehicle circuit body 10 is constituted by the instrument panel wire harness 12 and the floor wire harness 14 to be formed into a shape similar to a T-shape.

The wiring member connection structure according to the present embodiment is applied to the wiring member connection portion 13 between the other wiring members 18 and the control box 20. The other wiring members 18 are connected to the front end portion of the floor wire harness 14 to rise along the dash panel 16 in order to make connection between the instrument panel wire harness 12 and the floor wire harness 14 in the vehicle circuit body 10. The control box 20 is disposed on the intermediate portion of the instrument panel wire harness 12. It is a matter of course that the wiring member connection structure according to the present invention is not limited thereto but can be applied to various wiring member connection portions.

In the present embodiment, belt-like flat wiring members 15 are used in each of the instrument panel wire harness 12 routed in the dash panel 16 and the floor wire harness 14 routed in the underbody 11. On the other hand, round electric wires 17 are used as the other wiring members 18 connected to the front end portion of the floor wire harness 14. Incidentally, the other wiring members 18 are not limited to the round electric wires 17. That is, as long as the other wiring members 18 are wiring members that can be connected through a connector 51 that will be described later, the other wiring members 18 may be the round electric wires 17 or may be the flat wiring members 15. That is, the other wiring members 18 may have any wiring member form.

In addition, the number of pairs of the flat wiring members 15 and the other wiring members 18 to be connected to each other respectively may be either one or plural. Although a case where the electric wire connection structure according to the present embodiment includes two flat wiring members 15 and two other wiring members 18 will be described, the invention is not limited thereto.

Figure 2:
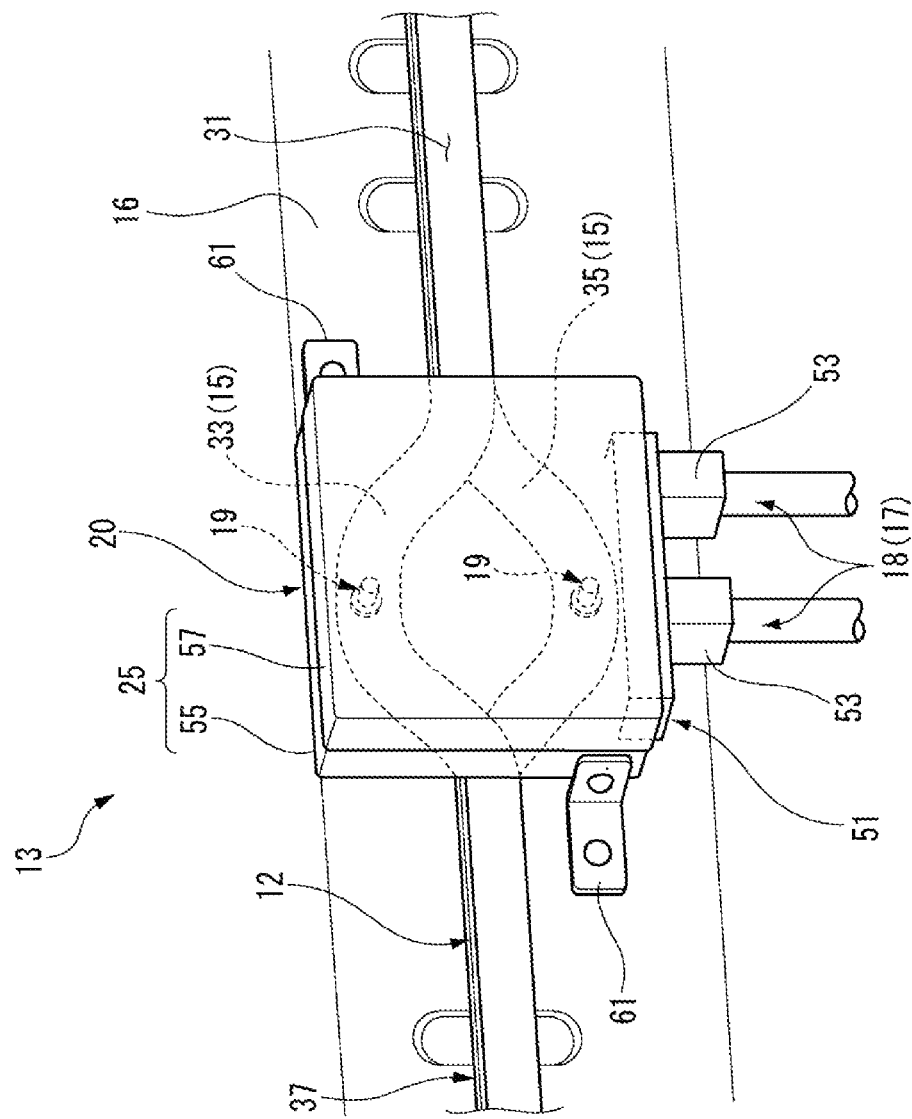
FIG. 2 is an enlarged perspective view of the wiring member connection portion shown in FIG. 1.
Figure 3:
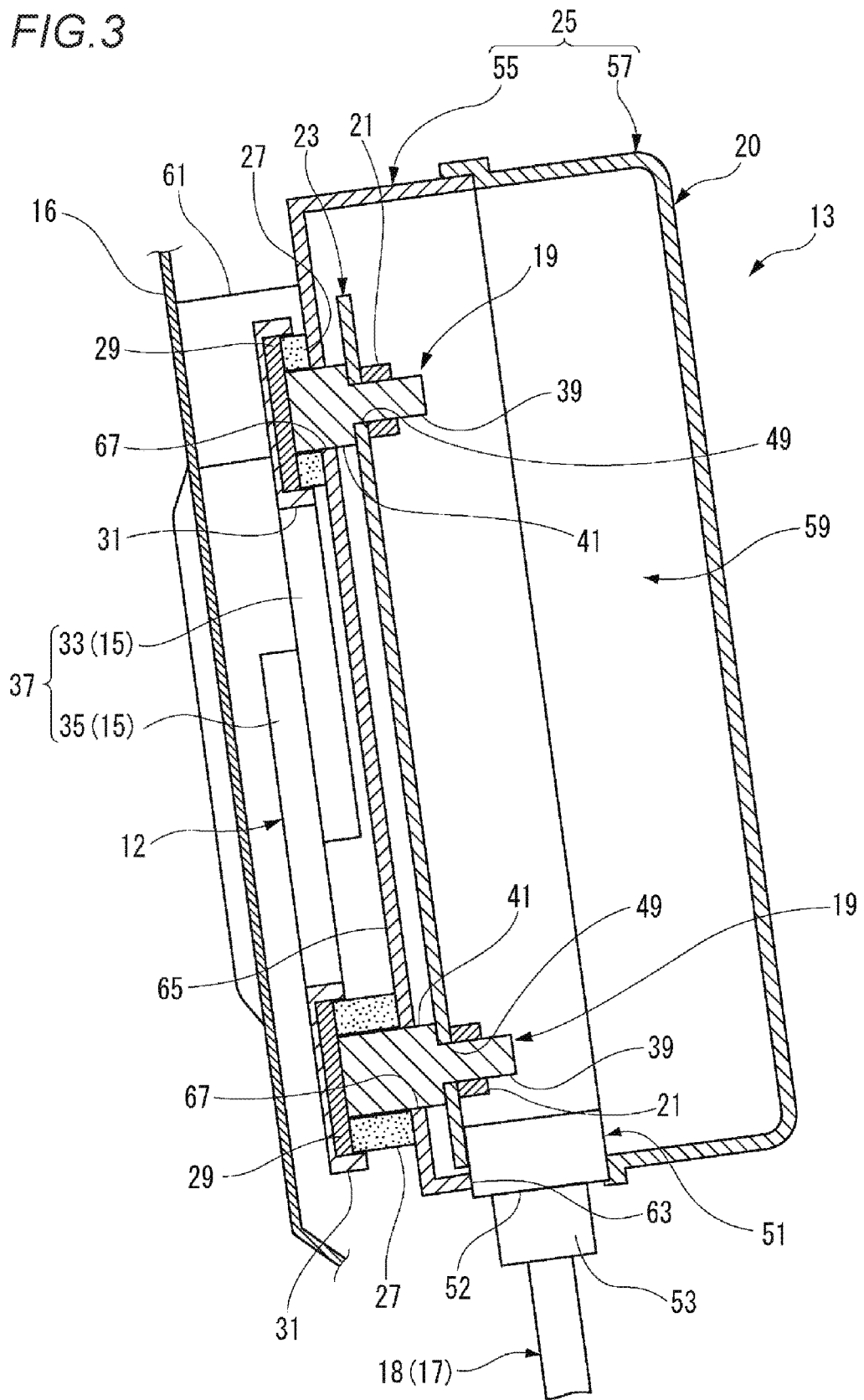
FIG. 3 is a longitudinal sectional view of the wiring member connection portion shown in FIG. 2.

FIG. 2 is an enlarged perspective view of the wiring member connection portion 13 shown in FIG. 1. FIG. 3 is a longitudinal sectional view of a casing 25 shown in FIG. 2.

The wiring member connection structure according to the present embodiment has the flat wiring members 15, bolts 19, a circuit board 23, and the casing 25 as essential constituent members to constitute the control box 20. The control box 20 is disposed on the intermediate portion of the instrument panel wire harness 12. The other wiring members 18 are branch-connected to the control box 20.

In addition to the aforementioned essential constituent members, the wiring member connection structure according to the present embodiment has annular packings 27 (see FIG. 3) mounted on outer circumferences of the bolts 19, as other main constituent members.

The flat wiring members 15 are formed by covering outer circumferences of flat conductors 29 (see FIG. 3) with insulating coatings 31. Each of the flat conductors 29 is made of a belt-like electrically conductive metal material (e.g. a copper alloy, an aluminum alloy, etc.) whose sectional shape is flat. The coating 31 that is, for example, made of an insulating resin material is provided on the outer circumference of the flat conductor 29 so as to cover the entire circumference thereof. The coating 31 covering the flat conductor 29 is formed, for example, by extrusion molding, lamination molding, powder coating, etc. The powder coating may be any of "electrostatic coating (air spray coating)" and "fluidizing coating (dip coating)".

The flat wiring members 15 can be laminated in layers. In the present embodiment, the flat wiring members 15 are laminated in two layers, i.e. an upper flat wiring member 33 and a lower flat wiring member 35. Incidentally, the flat wiring members 15 are used as a generic name for the upper flat wiring member 33 and the lower flat wiring member 35. The flat wiring members 15 constitute a laminated wiring body 37 when the flat wiring members 15 are laminated in two or more layers.

The bolts 19 according to the embodiment of the present invention are erect and bonded perpendicularly to one conductor flat surfaces of the flat conductors 29 exposed at portions of the flat wiring members 15 where the coatings 31 have been removed. The bolts 19 are bonded to the conductor flat surfaces, for example, by ultrasonic joining, friction stir welding, etc. Each of base portions of the bolts 19 serves as a circular cylinder portion 41 larger in diameter than an external thread portion 39. Since the circular cylinder portion 41 has a surface used to be bonded to the conductor flat surface, the bolt 19 secures a large bonding area. Incidentally, the bolt 19 may penetrate a through hole formed in the flat conductor 29 to be bonded and fixed to the flat conductor 29. However, it is desirable that the bolt 19 is bonded to the conductor flat surface in order to secure electric conductivity.

Figure 4:
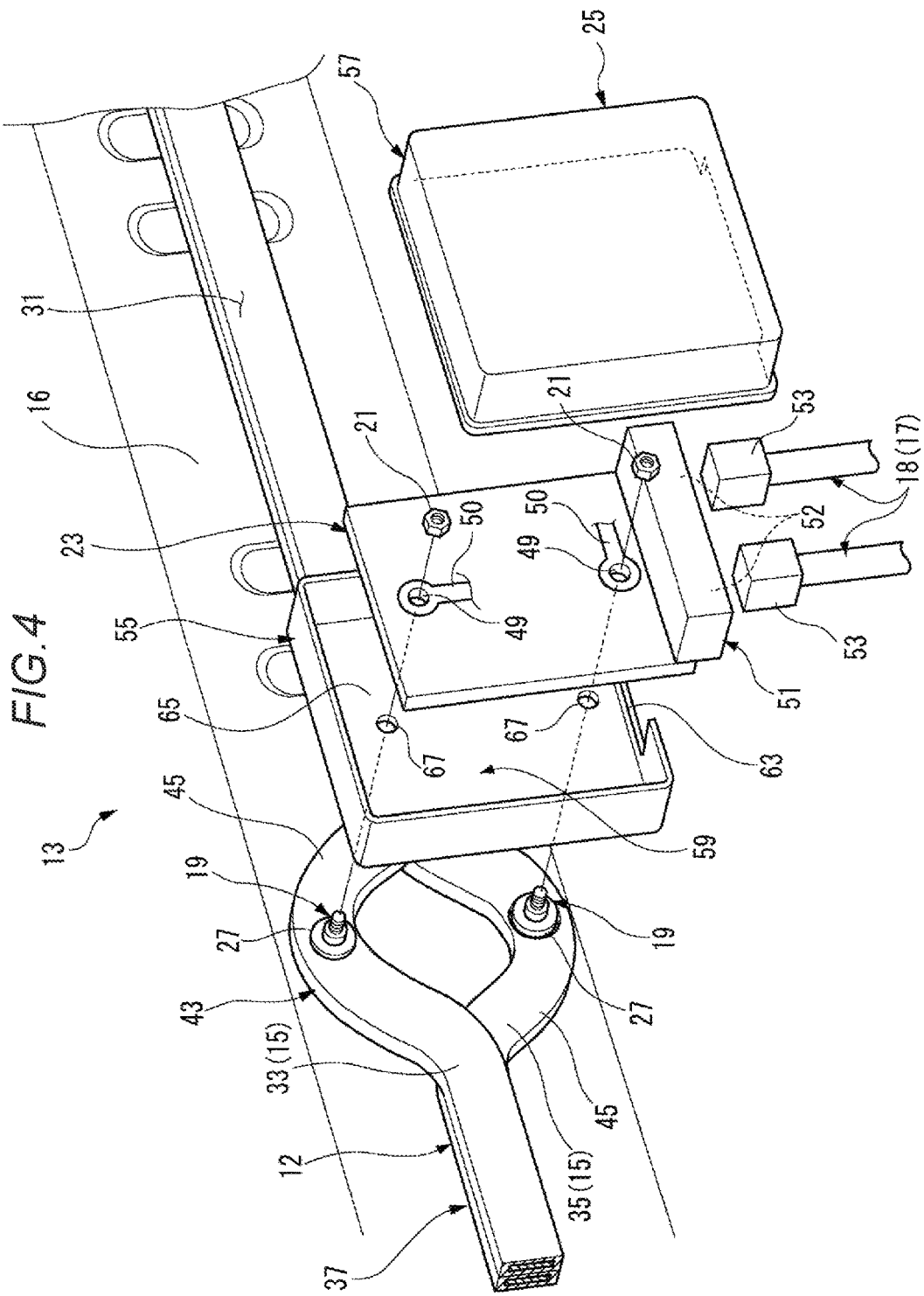
FIG. 4 is an exploded perspective view of the wiring member connection portion shown in FIG. 2.

FIG. 4 is an exploded perspective view of the wiring member connection portion 13 shown in FIG. 2.

The wiring member connection portion 13 provided with the wiring member connection structure according to the present embodiment is provided with an extraction portion 43. The extraction portion 43 is a portion for extracting the conductor flat surface of the lower flat wiring member 35 while avoiding the upper flat wiring member 33 in the flat wiring members 15 laminated in a thickness direction (i.e. the laminated wiring body 37).

In the present embodiment, the extraction portion 43 includes bypass portions 45 where the flat wiring members 15 are bent in a width direction in order to prevent the flat wiring members 15 from being superimposed on each other.

In the extraction portion 43, the upper flat wiring member 33 and the lower flat wiring member 35 are bent into substantially semicircular shapes inverted to each other in the width direction. Thus, the lower flat wiring member 35 is prevented from being superimposed on the upper flat wiring member 33.

Incidentally, both the upper flat wiring member 33 and the lower flat wiring member 35 are bent into the substantially semicircular shapes in the present embodiment. However, the bypass portions 45 may be replaced by a bypass portion 45 that has a configuration in which either the upper flat wiring member 33 or the lower flat wiring member 35 is bent.

The aforementioned bolts 19 are erect and bonded to both the bypass portions 45 of the upper flat wiring member 33 and the lower flat wiring member 35. In each of the bolts 19, the circular cylinder portion 41 is bonded to the flat conductor 29, as described above. The annular packing 27 made of rubber is mounted on an outer circumference of the circular cylinder portion 41 bonded to the flat conductor 29.

Figure 5:
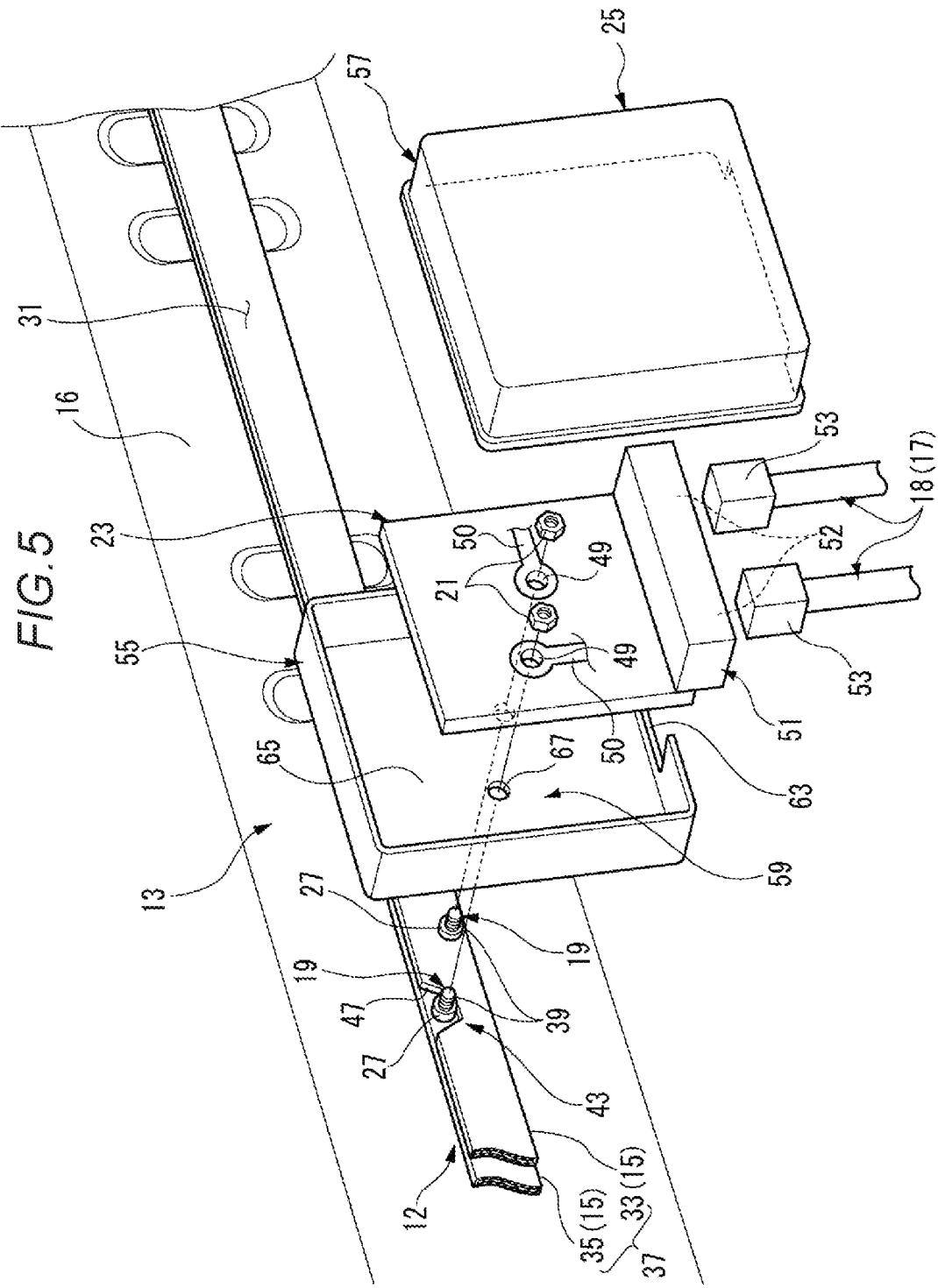
FIG. 5 is an exploded perspective view of a wiring member connection structure according to a modification in which an extraction portion of a laminated wiring body differs.

FIG. 5 is an exploded perspective view of a wiring member connection structure according to a modification in which an extraction portion 43 of a laminated wiring body 37 differs.

Incidentally, the extraction portion 43 in a wiring member connection portion 13 can be formed as a notch portion 47, as shown in FIG. 5. The notch portion 47 is a space formed by cutting out a side edge of an upper flat wiring member 33 in a width direction perpendicularly to an extension direction of the upper flat wiring member 33 so that another bolt 19 can be inserted through the notch portion 47.

A bolt 19 is erectly provided on the upper flat wiring member 33. The other bolt 19, which is bonded to a lower flat wiring member 35, is erectly provided on an upper surface of the lower flat wiring member 35 and at a position where the bolt 19 provided on the upper flat wiring member 33 and the other bolt 19 provided on the lower flat wiring member 35 are not superimposed on each other in the extension direction of the laminated wiring body 37. The other bolt 19 erectly provided on the lower flat wiring member 35 is inserted through the notch portion 47 formed in the upper flat wiring member 33. Thus, the bolt 19 conductively connected to the upper flat wiring member 33 and the other bolt 19 conductively connected to the lower flat wiring member 35 are disposed on an upper surface of the laminated wiring body 37 to be arranged side by side in the extension direction of the laminated wiring body 37 while shifted from each other in a width direction of the laminated wiring body 37.

As shown in FIG. 3, the circuit board 23 is fastened and fixed to the bolts 19. The circuit board 23 serves as a power supply circuit board formed into a square shape. External thread insertion holes 49 are formed in the circuit board 23. The external thread portions 39 of the bolts 19 penetrate the external thread insertion holes 49.

Each of the bolts 19 has a step portion between the external thread portion 39 and the circular cylinder portion 41. The step portion serve as a seat surface supporting a lower surface of the circuit board 23. Here, the circuit board 23 is supported horizontally to the upper surface of the laminated wiring body 37. Accordingly, height of the circular cylinder portion 41 of the other bolt 19 bonded to the lower flat wiring member 35 is higher than height of the circular cylinder portion 41 of the bolt 19 bonded to the upper flat wiring member 33 by thickness of the flat wiring member 15 in order to support the circuit board 23 horizontally to the upper surface of the laminated wiring body 37.

Nuts 21 are screwed on the external thread portions 39 that have penetrated the external thread insertion holes 49.

When the nuts 21 are tightened, the circuit board 23 is held between the seat surfaces and the nuts 21 to be fastened and fixed to the bolts 19. That is, the circuit board 23 is fixed to the laminated wiring body 37 through the bolts 19. Incidentally, the circuit board 23 can be fixed to the casing 25 in advance. The casing 25 will be described later.

The connector 51 is attached to one side portion of the circuit board 23. In the present embodiment, an integrated connector having two connector fitting portions 52 is shown as the connector 51 by way of example. However, a plurality of single connectors may be provided alternatively. Counterpart connectors 53 connected to terminals of the other wiring members 18 are fitted to the connector fitting portions 52 of the connector 51 respectively.

Circuit conductors 50 are formed in the circuit board 23. The circuit conductors 50 are formed, for example, by printing wirings or bus bars. The circuit conductors 50 conductively connect the bolts 19 to the different connector fitting portions 52 of the connector 51 respectively. That is, the circuit conductor 50 has a via whose one end is formed around the external thread insertion hole 49 to make contact with different bolt and nut pairs respectively. The via is conductively connected to a board side terminal piece housed respectively in the different connector fitting portions 52 formed in the connector 51.

The casing 25 covers the circuit board 23 watertightly. In the present embodiment, the casing 25 includes a lower casing part 55 and an upper casing part 57. The lower casing part 55 is formed into an opened flat square box shape having an upper surface as an opening portion. A board housing space 59 is provided inside the lower casing part 55. The upper casing part 57 covers the opening portion of the lower casing part 55 to thereby seal the board housing space 59. The lower casing part 55 and the upper casing part 57 are combined integrally by an elastic lock structure, a thread fastening structure, etc. The casing 25 can be fixed to the dash panel 16, for example, by use of brackets 61.

A board fixation portion (not shown) for fixing the circuit board 23 is formed in the casing 25. The board fixation portion is constituted, for example, by a broad fixation screw that penetrates the circuit board 23 and a casing side board fixation portion with which the board fixation screw is threadedly engaged. In addition thereto, the board fixation portion may have a board lock claw structure that is locked to an edge portion of the circuit board 23 to fix the circuit board 23. It is desirable that the circuit board 23 can be preassembled to the board housing space 59 of the casing 25 by the board fixation portion.

In the casing 25, a sealant retention groove is formed in mating faces (edges) of the lower casing part 55 and the upper casing part 57 and filled with a sealant of a rubber packing, foamed rubber urethane, etc. The sealant retention groove may be formed in any one of the lower casing part 55 and the upper casing part 57. In this case, the edge of the other of the lower casing part 55 and the upper casing part 57 abuts against the sealant. Thus, the lower casing part 55 and the upper casing part 57 can be formed into a structure in which the sealant is squashed to thereby prevent water from entering the casing when the upper casing part 57 and the lower casing part 55 are fitted to each other.

In addition, the casing 25 has a connector outlet 63 (see FIG. 3) exposing the connector fitting portions 52 of the connector 51 to the outside. The connector outlet 63 may be formed in each or one of the lower casing part 55 and the upper casing part 57. A gap between the connector outlet 63 of the casing 25 and the connector 51 is watertightly sealed by a sealant similar to or the same as the aforementioned sealant.

A casing bottom wall 65 (an opposed side wall to the bypass portions 45) of the lower casing part 55 is formed into a flat surface. Bolt insertion holes 67 are bored in the casing bottom wall 65 of the lower casing part 55 so that the bolts 19 can be inserted through the bolt insertion hole 67 to penetrate the circuit board 23. The casing bottom wall 65 makes contact with the annular packings 27 mounted on the outer circumferences of the circular cylinder portions 41, as shown in FIG. 3. Thus, a gap between the casing bottom wall 65 and the flat wiring members 15 is watertightly sealed by the annular packings 27.

Next, an assembling procedure of the wiring member connection portion 13 provided with the aforementioned wiring member connection structure according to the present embodiment will be described.

In the wiring member connection structure according to the present embodiment, the circuit board 23 is fixed to the lower casing part 55 in advance. In addition, the annular packings 27 are mounted in advance on the bolts 19 provided respectively on the bypass portions 45 of the laminated wiring body 37. The external thread portions 39 of the bolts 19 are inserted into the bolt insertion holes 67 of the lower casing part 55.

In the bolts 19 that have been inserted into the bolt insertion holes 67, the circular cylinder portions 41 penetrate the bolt insertion holes 67 of the casing bottom wall 65, and the external thread portions 39 penetrate the external thread insertion holes 49 of the circuit board 23. The nuts 21 are fastened to the external thread portions 39 that have penetrated the external thread insertion holes 49. Thus, the circuit board 23 is fixed to the bolts 19, and the casing bottom wall 65 is pressed against the annular packings 27.

Next, the upper casing part 57 is assembled to the lower casing part 55. Finally, the casing 25 is fixed to the dash panel 16 by the brackets 61. Thus, the casing 25 is attached to the laminated wiring body 37.

Finally, the counterpart connectors 53 provided at the terminals of the other wiring members 18 are fitted to the connector fitting portions 52 of the connector 51 exposed from the casing 25. As a result, the wiring member connection portion 13 is assembled completely. That is, the instrument panel wire harness 12 and the floor wire harness 14 in the vehicle circuit body 10 are connected to each other through the control box 20 disposed on the intermediate portion of the instrument panel wire harness 12.

Next, effects of the aforementioned configuration will be described.

In the wiring member connection structure according to the present embodiment, the bolts 19 are erect and bonded perpendicularly to the conductor flat surfaces of the flat conductors 29 exposed at the intermediate positions of the belt-like flat wiring members 15 where the coatings 31 have been removed. The bolts 19 penetrate the casing bottom wall 65 of the casing 25 covering the circuit board 23 so that the circuit board 23 can be fastened to the bolts 19. The connector 51 conductively connected to the bolts 19 is provided on the circuit board 23. The connector fitting portions 52 of the connector 51 are exposed to the outside from the casing 25.

The counterpart connectors 53 provided at the terminals of the other wiring members 18 are fitted to the connector fitting portions 52 exposed from the casing 25. That is, in a state in which the flat wiring members 15 are not cut but are continuous over an entire area in a longitudinal direction, the other wiring members 18 are electrically connected to the intermediate positions of the flat wiring members 15. Since the other wiring members 18 are connected to the flat wiring members 15 without dividing the flat wiring members 15, the number of connection places can be reduced.

As a result, the wiring member connection structure according to the present configuration can have higher electric connection reliability between the flat wiring members 15 and the other wiring members 18 than the background-art wiring member connection structure in which the two cut mainline wiring member parts are electrically connected through the power supply distribution box.

In addition, when, for example, the flat wiring members 15 are main power supply lines which should be sub-assembled, the power supply lines are not divided so that the number of electric wires can be also reduced.

According to the wiring member connection structure in the present embodiment, the two flat wiring members 15 are laminated to each other to thereby form the laminated wiring body 37 in which a plurality of circuits are laminated. In such a lamination structure, the upper flat wiring member 33 is superimposed on the lower flat wiring member 35 so that conductive connection to another wiring member 18 in the upper surface of the intermediate portion of the lower flat wiring 35 in the extension direction is normally difficult.

To solve this problem, the wiring member connection structure having the present configuration is provided with the extraction portion 43. The extraction portion 43 has a function to prevent the upper flat wiring member 33 from standing in the way of conductive connection of the lower flat wiring member 35 to the bolt 19 provided on the upper surface of the lower flat wiring member 35.

Thus, conductive connection to the flat wiring members 15 in the respective layers of the laminated wiring body 37 can be performed at desirable intermediate positions in the extension direction of the laminated wiring body 37. As a result, the laminated wiring body 37 routed in a vehicle can be used to make it easy to connect a power supply etc. to accessories at a short distance. The accessories are mounted on desirable positions of the vehicle. That is, the flat wiring members 15 can be electrically connected to the other wiring members 18 in a state in which the flat wiring members 15 are not cut but extend continuously over the entire area in the longitudinal direction. In other words, the degree of freedom for selecting the connection positions of the other wiring members 18 is improved.

In addition, in the wiring member connection structure according to the present embodiment, the bypass portions 45 serving as the extraction portion 43 where the flat wiring members 15 laminated on each other are bent in the width direction thereof to prevent the flat wiring members 15 from being superimposed on each other are formed in the flat wiring members 15 as shown in FIG. 4. The bolt 19 erectly provided on the bypass portion 45 of one of the flat wiring members 15 is not superimposed on the other flat wiring member 15 when the flat wiring members 15 are superimposed on each other.

Thus, the bolts 19 are disposed on the upper surface of the laminated wiring body 37 to be arranged side by side in the width direction crossing the extension direction of the laminated wiring body 37. The circuit board 23 is fastened and fixed to the bolts 19. In the wiring member connection structure, the pair of the bolts 19 that are, for example, connected to a positive electrode and a negative electrode can be provided on the laminated wiring body 37 relatively narrow in width, and side by side in the width direction of the laminated wiring body 37. In addition, the insertion hole of the lower flat wiring member 35 through which the bolt 19 is inserted does not have to be bored in the upper flat wiring member 33. Accordingly, a decrease of a sectional area in the upper flat wiring member 33 can be suppressed.

Further, in the modification of the wiring member connection structure according to the present embodiment, the other bolt 19 is erectly provided on the lower flat wiring member 35 and at a position where the bolt 19 erectly provided on the upper flat wiring member 33 and the other bolt 19 erectly provided on the lower flat wiring member 35 are not superimposed on each other in the extension direction of the laminated wiring body 37, as shown in FIG. 5. When the upper flat wiring member 35 is superimposed on the lower flat wiring member 33, the other bolt 19 erectly provided on the lower flat wiring member 35 is inserted through the notch portion 47 that is formed in the upper flat wiring member 33. Thus, the other bolt 19 conductively connected to the lower flat wiring member 35 and the bolt 19 conductively connected to the upper flat wiring member 33 are disposed on the upper surface of the laminated wiring body 37 to be arranged side by side in the extension direction of the laminated wiring body 37. The circuit board 23 is fastened and fixed to the bolts 19. In the modification, the bolts 19 can be disposed along the extension direction of the laminated wiring body 37 and within the width range of the laminated wiring body 37.

Further, in the wiring member connection structure according to the present embodiment, the annular packings 27 are mounted on the outer circumferences of the bolts 19 and the circuit board 23 is fastened and fixed to the bolts 19 to squash the annular packings 27. Thus, connection portions between the flat wiring members 15 and the casing 25 can be made waterproof easily.

Accordingly, according to the wiring member connection structure according to the present embodiment, the round electric wires 17 can be connected to the intermediate positions of the wiring members with high connection reliability.

The present invention is not limited to the aforementioned embodiment. Combination of the constituent members of the embodiment with one another or changes or applications performed by those skilled in the art based on the description of the present invention and the well-known technique are also intended by the present invention and included in the scope in which the present invention seeks for protection.

Here, the aforementioned characteristics of the wiring member connection structure according to the embodiment of the present invention will be briefly summarized and listed respectively in the following items [1] to [5].

[1] A wiring member connection structure including:
a flat wiring member (15) formed by covering an outer circumference of a belt-like flat conductor (29) with an insulating coating (31);
a bolt (19) that is erect and bonded perpendicularly to a conductor flat surface of the flat conductor exposed at an intermediate position of the flat wiring member where the coating has been removed;
a circuit board (23) that has a connector (51) conductively connected to the bolt through a circuit conductor (50) and that is fastened and fixed to the bolt penetrating the circuit board; and
a casing (25) that has a casing bottom wall (65) including a bolt insertion hole (67) through which the bolt is inserted to penetrate the circuit board, and that covers the circuit board so as to expose a connector fitting portion (52) of the connector to the outside.

[2] The wiring member connection structure according to the aforementioned item [1], wherein
a plurality of flat wiring members (15) is laminated in a thickness direction thereof, and
an extraction portion (43) is provided for extracting the bolt (19) bonded to the conductor flat surface of a lower one (35) of the laminated flat wiring members while avoiding an upper one (33) of the laminated flat wiring members.

[3] The wiring member connection structure according to the aforementioned item [2], wherein:
the extraction portion (43) serves as a bypass portion (45) where at least one of the flat wiring members (15) is bent in a width direction thereof so as to prevent the flat wiring members (15) from being superimposed on each other.

[4] The wiring member connection structure according to the aforementioned item [2], wherein:
the extraction portion (43) serves as a notch portion (47) that is formed by cutting out a side edge of the upper flat wiring member (33) in a width direction perpendicular to an extension direction of the upper flat wiring member (33) so that the bolt (19) is inserted through the notch portion (47).

[5] The wiring member connection structure according to any one of the aforementioned items [1] to [4], wherein
an annular packing (27) mounted on an outer circumference of the bolt (19) seals a gap between the casing bottom wall (65) and the flat wiring member (15) watertightly.

What is claimed is:

1. A wiring member connection structure comprising:
a flat wiring member formed by covering an outer circumference of a belt-like flat conductor with an insulating coating;
a bolt that is erect and bonded perpendicularly to a conductor flat surface of the flat conductor exposed at an intermediate position of the flat wiring member where the coating is removed;
a circuit board that has a connector conductively connected to the bolt through a circuit conductor and that is fastened and fixed to the bolt penetrating the circuit board; and
a casing that has a casing bottom wall including a bolt insertion hole through which the bolt is inserted to penetrate the circuit board, and that covers the circuit board so as to expose a connector fitting portion of the connector to the outside.

2. The wiring member connection structure according to claim 1, wherein
a plurality of flat wiring members is laminated in a thickness direction thereof, and
an extraction portion is provided for extracting the bolt bonded to the conductor flat surface of a lower one of the laminated flat wiring members while avoiding an upper one of the laminated flat wiring members.

3. The wiring member connection structure according to claim 2, wherein
the extraction portion serves as a bypass portion where the flat wiring member is bent in a width direction thereof so as to prevent the flat wiring members from being superimposed on each other.

4. The wiring member connection structure according to claim 2, wherein
the extraction portion serves as a notch portion that is formed by cutting out a side edge of the upper flat wiring member in a width direction perpendicular to an extension direction of the upper flat wiring member so that the bolt is inserted through the notch portion.

5. The wiring member connection structure according to claim 1, wherein an annular packing mounted on an outer circumference of the bolt seals a gap between the casing bottom wall and the flat wiring member watertightly.

* * * * *